United States Patent [19]

Feild, Jr.

[11] Patent Number: 4,695,476
[45] Date of Patent: Sep. 22, 1987

[54] PROCESS FOR COATING THE INTERNAL SURFACE OF ZIRCONIUM TUBES WITH NEUTRON ABSORBERS

[75] Inventor: Alexander L. Feild, Jr., Mt. Lebanon Township, Allegheny County, Pa.

[73] Assignee: Westinghouse Electric Corp., Pittsburgh, Pa.

[21] Appl. No.: 742,153

[22] Filed: Jun. 6, 1985

[51] Int. Cl.⁴ ............................................. G21C 3/06
[52] U.S. Cl. ..................................... 427/6; 427/237; 376/414; 376/419
[58] Field of Search ............... 376/419, 417, 416, 414, 376/333; 427/237, 248.1, 6; 148/6.3

[56] References Cited

U.S. PATENT DOCUMENTS

| | | |
|---|---|---|
| 2,983,663 | 5/1961 | Bassett . |
| 3,103,476 | 9/1963 | Mumm . |
| 3,274,066 | 9/1966 | Zumwalt . |
| 3,301,763 | 1/1967 | Beatly et al. . |
| 3,427,222 | 2/1969 | Bianchoria et al. . |
| 3,510,398 | 5/1970 | Wood . |
| 3,561,920 | 2/1971 | Kinter et al. .......................... 427/237 |
| 3,625,821 | 12/1971 | Ricks . |
| 3,650,896 | 3/1972 | Goeddel . |
| 3,778,885 | 12/1973 | Stoll . |
| 3,928,130 | 12/1975 | Pawlin et al. . |
| 4,123,326 | 10/1978 | Shinbo . |
| 4,229,260 | 10/1980 | Johnson et al. . |
| 4,252,691 | 2/1981 | Lipp et al. . |
| 4,385,645 | 5/1983 | Campbell et al. ..................... 427/237 |
| 4,474,728 | 10/1984 | Radford . |
| 4,522,849 | 6/1985 | Lewardowski ...................... 427/237 |
| 4,541,984 | 9/1985 | Palmer ................................. 376/417 |
| 4,560,575 | 12/1985 | Eisenstatt et al. ................... 376/414 |
| 4,582,676 | 4/1986 | Chubb .................................. 376/417 |
| 4,582,751 | 4/1986 | Vasitos et al. ...................... 427/248.1 |
| 4,587,087 | 5/1986 | Radford et al. ...................... 376/417 |

FOREIGN PATENT DOCUMENTS

| | | | |
|---|---|---|---|
| 0164011 | 12/1981 | Japan ............................... 427/248.1 |
| 0914163 | 12/1962 | United Kingdom ................ 376/419 |

OTHER PUBLICATIONS

*Vapor Deposition,* Powell et al,: John Wiley & Sons, Inc., 1966, pp. 343-352.

*Chemical Vapor Deposition of Refractory Metals, Alloys, and Compounds,* Schaffhauser, American Nuclear Society, 1967, pp. 205-216.

Primary Examiner—Deborah L. Kyle
Assistant Examiner—Daniel Wasil
Attorney, Agent, or Firm—D. M. Satina

[57] ABSTRACT

A process for forming a boron-containing coating on the internal surface of a zirconium or zirconium alloy hollow tube by heating the internal surface to a temperature of between 200°–450° C. and passing through the tube a mixture of a volatilized boron compound in helium or argon, such that the boron compound decomposes to form an integral boron containing coating on the internal surface.

25 Claims, 3 Drawing Figures

PROCESS FOR COATING THE INTERNAL SURFACE OF ZIRCONIUM TUBES WITH NEUTRON ABSORBERS

FIELD OF THE INVENTION

The present invention relates to a process for forming a coating of a neutron absorber on the inner surface of zirconium tubes for use in nuclear reactor components, and to an improved nuclear fuel cladding and fuel element.

BACKGROUND OF THE INVENTION

In the production of electrical energy from nuclear reactor systems, the reactor provides heat for steam production and subsequent production of electricity. In the nuclear reactor, nuclear fuel rods are present which contain a nuclear fuel such as pellets of uranium dioxide or a mixture of uranium and plutonium dioxides. These fuel rods are metallic tubular shells, or cladding, which contain the fuel pellets and which must maintain their integrity so as to prevent any leakage into or out of the shell.

It is well-known that the incorporation, in various manners of a neutron absorber with nuclear fuel rods, which enables the use of excessive amounts of fuel in a reactor during the initial life of the fuel, can extend the life of the fuel rods. In some instances, the neutron absorber is mixed directly with the fuel and integrated therewith, while in other instances, a neutron absorber coating may be applied to the surface of fuel pellets, or discrete forms of a neutron absorber may be interspersed between conventional fuel pellets, or otherwise located within the cladding for the nuclear fuel. In U.S. Pat. No. 3,427,222, for example, a fuel rod is comprised of a tubular cladding that contains fuel pellets which have a fusion-bonded coating on the surface of each pellet, the coating comprised of a boron-containing material that functions as a neutron absorber.

It has also been proposed to provide cladding materials such as zirconium-based alloys that have various coatings or barrier means on the inside wall of the tubular cladding to protect the cladding from attack by constituents released from the nuclear fuel during operation of a reactor containing the fuel rod.

The use of a boron-containing compound in or on the cladding material has been proposed. U.S. Pat. No. 3,103,476 discloses the incorporation of a nuetron absorber, such as boron, into the cladding of a nuclear fuel element. The boron is added to the cladding, which is preferably stainless steel, but may be zirconium or other material, in an amount of 200-1000 parts of natural boron per million parts of cladding material and homogeneously dispersed throughout the cladding. U.S. Pat. No. 3,625,821 describes a nuclear fuel element that has a zirconium or zircaloy cladding tube, with the inner surface of the tube coated with boron which is a neutron absorber. The boron is dispersed, as finely dispersed particles, in a matrix of nickel or other retaining metal.

Various methods have been proposed for formation of a coating on the inner surface of a fuel rod cladding. U.S. Pat. No. 3,274,066 teaches formation of a barrier material between fuel bodies and a graphite cladding shell by treating the graphite walls by exposure to a gaseous substance which can be deposited on the internal walls, and either simultaneously or subsequently reacted to chemically combine with the graphite to form a desired carbide. A vaporous silicon compound may be decomposed at a relatively low temperature in suitable atmosphere, such as hydrogen, to form a barrier layer of silicon carbide. In U.S. Pat. No. 4,229,260 a method of coating an oxygen-gettering material on the inner surface of a cladding is disclosed. The cladding is heated to 400°–450° C. while a volatile compound of the coating metal is heated to vaporize the compound and mixed with a heated inert gas. The mixture is then passed over the heated substrate whereby the vapor of the compound is decomposed and deposites the metal on the cladding. The coating is a layer of chromium preferably resulting from thermal decomposition of dicumene chromium.

Methods of vapor phase deposition of boron and borides onto metallic substrates are described in Chapter 11 of *Vapor Deposition*, Carroll F. Powell, Joseph H. Oxley and John M. Blocher, Jr. ; John Wiley & Sons, Inc. (1966), pp. 343–352. The two methods described are (1) direct boride deposition from an atmosphere containing both boron and the metal component in the form of volatilized compounds; and (b) boronizing, or boriding, the surface layer of an object by heating it in an atmosphere of a volatile boron compound. The thermal decomposition of a bornon hydride, such as diborane, or of an organoboron compound, such as trimethylboron are disclosed.

In the present process, the vapor phase deposition of a boron coating on the internal surface of a zirconium tube is effected at temperatures that do not affect the metallurgical structure of the tube for use in nuclear reactors, expecially as a fuel rod cladding.

SUMMARY OF THE INVENTION

A hollow zirconium or zirconium alloy tube is provided with a boron-containing coating on the internal surface of the tube by heating the internal surface to 200°–450° C. and passing through the tube a volatilized boron compound that is admixed with helium or argon, as a carrier gas. The boron compound is selected from inorganic or organic boron compounds that are volatilizable at the specified temperature and will decompose to form a boron or boron carbide coating on the internal surface of the tube. The boron-containing coating is integral with the inner surface of the tube and of a thickness of less than about 1 mil. The thickness may be varied along the length of the tube.

DETAILED DESCRIPTION

Figure 1:
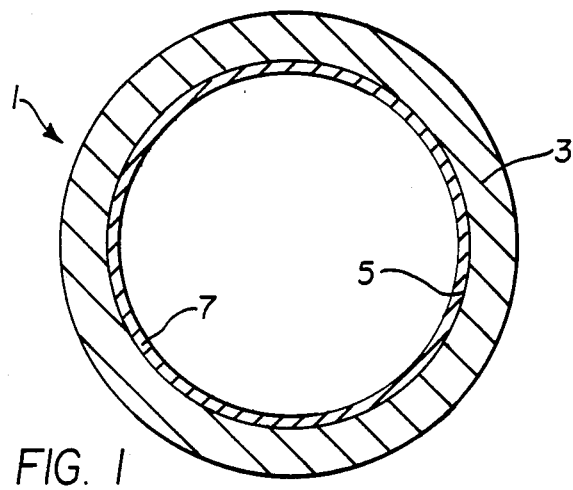
FIG. 1 shows a transverse cross-section through a tubular cladding produced by the process of the present invention.

The present invention provides a process for forming a boron-containing integral coating or layer of a controlled thickness as a neutron absorber on the internal surface of hollow zirconium tubular members used in nuclear reactor components. The tubular members may be used as cladding for fuel elements, thimble tubes, or other zirconium components in nuclear reactor fuel assemblies or core components.

The hollow tubular member is formed from zirconium or a zirconium alloy which contains less than about 5 percent by weight of alloying elements, usable in nuclear reactors. Such zirconium alloys contain elements which increase the mechanical properties of zirconium metal and/or the corrosion resistance of zirconium metal. The elements that are used in the formation of such alloys include niobium, oxygen, tin, iron, chromium, nickel, molybdenum, copper, vanadium and the like. Especially useful alloys are a zirconium alloy containing about 2.5 percent niobium, and the zirconium alloys known as Zircaloy-2 and Zircaloy-4. Zircaloy-2 contains, by weight, about 1.2–1.7 percent tin; 0.07–0.20 percent iron; 0.05–0.15 percent chromium; and about 0.03–0.08 percent nickel; the balance being zirconium. Zircaloy-4 contains, by weight, about 1.2–1.7 percent tin; 0.12–0.18 percent iron, and 0.05–0.15 percent chromium, the balance being zirconium. For the purpose of brevity, the term "zirconium" will be used in the following description although it is to be understood that the use of that term is meant to include the aforementioned zirconium alloys, as well as zirconium metal alone.

In the present process, the hollow tubular member is heated such that the internal surface thereof is raised to an elevated temperature of between about 200°–450° C. There is then passed through the hollow tubular member a flow of a gaseous mixture of a volatilizable boron compound, that will decompose at said elevated temperature, in a carrier gas selected from helium or argon. The boron compounds usable in the present process are those compounds that are volatilizable for admixture with a carrier gas and which will decompose at a temperature of between 200°–450° C., in the presence of zirconium, to form a boron coating on the internal surface of the hollow zirconium tube. Inorganic boron compounds such as boranes that are volatilizable and decompose at the desired temperatures, include diborane ($B_2H_6$; b.p. −93° C.), pentaborane ($B_5H_9$; b.p. 59° C.), hexaborane ($B_6H_{10}$; b.p. 0° C.) and decaborane ($B_{10}H_{14}$; b.p. 213° C.). Organic boron compounds that are volatilizable and decompose at the desired temperatures include dimethylborine [$B(CH_3)_2$; b.p. 0° C.], trimethylborine [$B(CH_3)_3$; b.p. 20° C.], and triethylborine [$B(C_2H_5)_3$; b.p. 96° C.]. In addition, zirconium borohydride [$Zr(BH_4)_4$; b.p. 20°–50° C.] may be used.

The internal surface of the zirconium tubular member must be in an active state, which means that the zirconium metal is not in a deactivated or contaminated condition. The provision of an active state is achieved by cleaning the internal surface, such as by acid pickling, erosion blasting of the surface, or passing a surface conditioner through the tubular member. In essence, the active state means that the zirconium metal exposed at the internal surface is clean and not chemically or physically contaminated. With an active surface present, the decomposition of the boron-containing compound, at the specified temperature, is effected with reaction with the internal zirconium surface to provide an integral, adherent, coating of the nuetron absorber on the internal surface.

In carrying out the present process, the volatilizable boron-containing compound is volatilized and mixed with helium or argon and the resultant gaseous mixture, at atmospheric pressure, is passed through a zirconium tubular member that has an internal surface at a temperature of between 200°–450° C. The preferred elevated temperature may vary dependent upon the boron compound decomposed in the presence of the active zirconium internal surface. A preferred elevated temperature of 250°–450° C. is to be used where an inorganic boron compound is used, and most preferably a temperature of about 275°–375° C. A preferred elevated temperature of 250°–400° C. is to be used where an organic boron compound is used, and most preferably, a temperature of about 275°–300° C. With zirconium borohydride, a preferred elevated temperature is between about 200°–400° C. The boron-containing compound should be present in the gaseous admixture in an amount that provides a partial pressure of the boron-containing compound of between 1–5 mm mercury where an inorganic boron-containing compound is used; a partial pressure of about 1–3 mm mercury where an organic boron-containing compound is used; and a partial pressure of about 1–50 mm mercury where zirconium borohydride is used; at a total pressure of one atmosphere. With the use of inorganic boron-containing compounds or zirconium borohydride, no reducing gases should be present in the mixture. With the use of organic boron-containing compounds, however, the addition of about 2–5 percent by volume of hydrogen, based on the volume of the helium or argon, may be made to combine with free carbon produced during the decomposition of the organic boron-containing compound.

The time of exposure of the boron-containing compound with the internal surface of the zirconium tubular member will vary dependent upon the temperature, partial pressure, and boron-containing compound used, but should be that which is sufficient to form a coating of a desired thickness. The thickness of the boron coating may vary dependant upon the use to which the tubular member is to be put, but must be less than 1 mil in thickness, and preferably about 0.5 mil or less.

An advantage of the present process is the ability to form a neutron absorber coating on the internal surface of a zirconium tube that will vary in thickness along the length of the tube where desired. By raising the temperature of a section of the tube to a temperature $T_2$, which is in excess of the temperature $T_1$ of the remainder of the tube, a thicker coating will be formed along that section than is formed along the remainder of the tube. This is very disirable, for example, in a fuel tube cladding where a thicker coating might be beneficial in the central section of the cladding relative to the end sections of the cladding.

Another advantage of the present process is the use of relatively low temperatures, 200°–450° C., which will not affect the metallurgical structure of the tubular member, since annealing of such tubular members generally occurs at higher temperatures. Thus, a final annealed cladding can be coated on the internal surface with boron, without adversely affecting other properties of the cladding.

Referring now to the drawings, there is illustrated a nuclear fuel cladding and a fuel rod utilizing the process of the present invention. In FIG. 1, a transverse cross-section of a cladding 1 prepared by the present process is comprised of a zirconium tube 3 having an internal surface 5, with a boron-containing coating 7 integrally formed with the internal wall.

Figure 3:
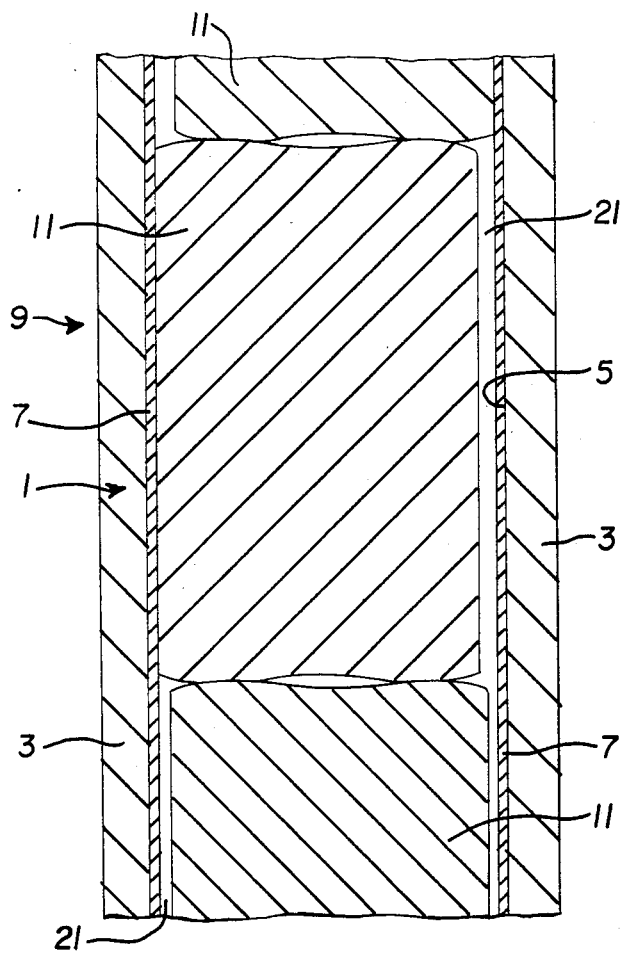
FIG. 3 shows an enlarged cross-sectional view of the fuel element illustrated in FIG. 2 exposing a diametrical, longitudinal plane of the tubular cladding.
Figure 2:
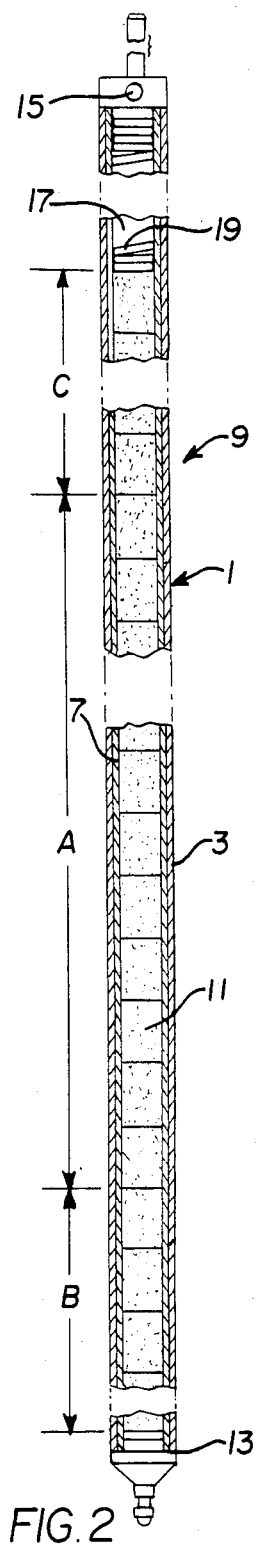
FIG. 2 shows a schematic representation of a partial cross-section through a nuclear reactor fuel element having the cladding prepared according to the process of the present invention.

A nuclear fuel element 9, using the cladding 1 prepared according to the present invention, is illustrated in FIGS. 2 and 3 for hermetically sealing fuel pellets. The fuel pellets 11, are conventional pellets, preferably sintered pellets of enriched uranium dioxide, or mixed uranium-plutonium dioxide. The pellets are retained within the cladding 1 by a bottom Zircaloy end plug 13 which has previously been welded to the composite tubular cladding, and a welded Zircaloy top end cap 15. A void space or plenum 17 is provided between the top pellet and the Zircaloy top end cap 15 and a biasing means, such as spring 19 restrains the pellets 11 within the cladding 1, with clearance spaces 21 (FIG. 2) left between the pellets and the boron-containing coating 5 of the cladding 1. The clearance space and plenum are filled with a high purity, inert atmosphere having high thermal conductivity, such as high purity helium pressurized to about 2 to 5 atmosphere (STP). With the ability to form a thicker boron-containing coating on the internal surface, when desired, an intermediate section A (FIG. 3) of the cladding 1 can be formed having a thicker boron-containing coating that is thicker than the end portions B and C thereof.

What is claimed is:

1. A process for forming (a) an integral, adherent boron coating on the internal surface of a hollow tube of a metal, selected from zirconium and a zirconium alloy for use in a nuclear reactor component comprising:
    heating the internal surface of the hollow tube to be coated to an elevated temperature of between about 200°–450° C., said internal surface being in an active state; and
    passing a mixture of a volatilized boron compound in a carrier gas, selected from the group consisting of helium and argon, through the heated tube, the volatilized boron compound selected from the group consisting of boron compounds which will decompose at said elevated temperature, whereby the boron compound is heated by said internal surface of the tube, decomposes, and a boron coating is deposited on said internal surface.

2. The process as defined in claim 1 wherein said hollow tube is of a zirconium alloy consisting of Zircaloy-2.

3. The process as defined in claim 1 wherein said hollow tube is of a zirconium alloy consisting of Zircaloy-4.

4. The process as defined in claim 1 wherein said hollow tube is of a zirconium alloy containing about 2.5 percent by weight niobium.

5. The process as defined in claim 1 wherein said boron compound is an inorganic boron compound selected from the group consisting of diborane, pentaborane, hexaborane and decaborane.

6. The process as defined in claim 5 wherein the internal surface of said hollow tube is heated to an elevated temperature of between 275°–375° C.

7. The process as defined in claim 1 wherein said boron compound is an organic boron compound selected from the group consisting of dimethylborine, trimethylborine and diethylborine.

8. The process as defined in claim 7 wherein the internal surface of said hollow tube is heated to an elevated temperature of between 275°–300° C.

9. The process as defined in claim 1 wherein said boron compound is zirconium borohydride.

10. The process as defined in claim 1 wherein said boron coating is of a thickness less than 1 mil.

11. The process as defined in claim 10 wherein a section of the internal surface of the hollow tube to be coated is heated to a temperature in excess of the elevated temperature of the remainder of said internal surface, whereby a thicker boron coating is formed on the internal surface of said section relative to the remainder of said internal surface.

12. The process as defined in claim 8 wherein hydrogen gas is added to the volatilized boron compound and carrier gas in an amount of between about 2 to 5 percent of the volume of the carrier gas.

13. A process for forming an integral, adherent boron carbide coating on the internal surface of a hollow tube of a metal, selected from zirconium and a zirconium alloy, for use in a nuclear reactor component comprising:
    heating the internal surface of the hollow tube to be coated to an elevated temperature of between about 200°–450° C., said internal surface being in an active state; and
    passing a mixture of a volatilized boron compound in a carrier gas, selected from the group consisting of helium and argon, through the heated tube, the volatilized boron compound selected from the group consisting of boron compounds which will decompose at said elevated temperature, whereby the boron compound is heated by said internal surface of the tube, decomposes, and a boron carbide coating is deposited on said internal surface.

14. The process as defined in claim 13 wherein said hollow tube is of a zirconium alloy consisting of Zircaloy-2.

15. The process as defined in claim 13 wherein said hollow tube is of a zirconium alloy consisting of Zircaloy-4.

16. The process as defined in claim 13 wherein said hollow tube is of a zirconium alloy containing about 2.5 percent by weight niobium.

17. The process as defined in claim 13 wherein said boron compound is an inorganic boron compound selected from the group consisting of diborane, pentaborane, hexaborane and decaborane.

18. The process as defined in claim 17 wherein the internal surface of said hollow tube is heated to an elevated temperature of between 275°–375° C.

19. The process as defined in claim 13 wherein said boron compound is an organic boron compound selected from the group consisting of dimethylborine, trimethylborine and diethylborine.

20. The process as defined in claim 19 wherein the internal surface of said hollow tube is heated to an elevated temperature of between 275°–300° C.

21. The process as defined in claim 20 wherein hydrogen gas is added to said boron compound and said carrier gas in the amount of between about 2 to 5 percent of the volume of the carrier gas.

22. The process as defined in claim 13 wherein said boron compound is zirconium borohydride.

23. The process as defined in claim 13 wherein said boron-containing coating is of a thickness less than 1 mil.

24. A process for forming an integral, adherent boron-containing coating on the internal surface of a hollow tube of a metal, selected from zirconium and a zirconium alloy, for use in a nuclear reactor component comprising:
    heating a first portion of the internal surface of the hollow tube to be coated to a first elevated temperature of between 200°–450° C., said first portion of said internal surface being in an active state;
    heating a second portion of the internal surface of the hollow tube to be coated to a second elevated temperature of between 200°–450° C., said second portion of said internal surface being in an active state, said second elevated temperature being higher than said first elevated temperature;

passing a mixtue of a volatilized boron compound in a carrier gas, selected from the group consisting of helium and argon, through the heated tube, the volatilized boron compound selected from the group consisting of boron compounds which will decompose at said first and said second elevated temperatures, whereby the boron compound is heated by said first portion of said internal surface, decomposes and a boron-containing coating of a first thickness is deposited on said first portion and the boron compound is heated by said second portion of said internal surface, decomposes, and a boron-containing coating of a second thickness is deposited on said second portion of said internal surface, said second thickness being greater than said first thickness.

25. The process as defined in claim 24 wherein said hollow tube is of a zirconium alloy selected from the group consisting of Zircaloy-2, Zircaloy-4, and a zirconium alloy containing about 2.5 percent by weight niobium.

* * * * *